United States Patent
Prohaska et al.

(10) Patent No.: US 8,289,082 B2
(45) Date of Patent: Oct. 16, 2012

(54) CIRCUIT AND METHOD FOR ADJUSTING AN OFFSET OUTPUT CURRENT FOR AN INPUT CURRENT AMPLIFIER

(75) Inventors: Armin Prohaska, Ulm-Ermingen (DE); Terje Saether, Trondheim (NO); Holger Vogelmann, Schwendi (DE)

(73) Assignee: Atmel Corporation, San Jose, CA (US)

( * ) Notice: Subject to any disclaimer, the term of this patent is extended or adjusted under 35 U.S.C. 154(b) by 0 days.

(21) Appl. No.: 12/977,034

(22) Filed: Dec. 22, 2010

(65) Prior Publication Data
US 2011/0148380 A1    Jun. 23, 2011

Related U.S. Application Data

(60) Provisional application No. 61/289,846, filed on Dec. 23, 2009.

(30) Foreign Application Priority Data

Dec. 23, 2009   (DE) .................. 10 2009 060 504

(51) Int. Cl.
    *H03F 3/04* (2006.01)
(52) U.S. Cl. ............................... 330/288; 330/9
(58) Field of Classification Search ............... 330/9, 51, 330/263, 265, 267, 288
    See application file for complete search history.

(56) References Cited

U.S. PATENT DOCUMENTS

| | | | | |
|---|---|---|---|---|
| 5,410,274 A * | 4/1995 | Birdsall et al. | ................ | 330/265 |
| 5,565,813 A | 10/1996 | Connell et al. | | |
| 6,281,730 B1 * | 8/2001 | Vu | ................ | 330/288 |
| 6,819,182 B2 * | 11/2004 | Sibrai | ................ | 330/288 |
| 8,044,719 B2 * | 10/2011 | Norimatsu et al. | ........... | 330/251 |
| 2003/0210092 A1 | 11/2003 | Mehr et al. | | |

* cited by examiner

*Primary Examiner* — Khanh V Nguyen
(74) *Attorney, Agent, or Firm* — Baker Botts L.L.P.

(57) ABSTRACT

A circuit and a method for correcting an offset is provided that includes a current amplifier and an adjusting circuit for correcting an offset of an output current of the current amplifier. Wherein the adjusting circuit has a controlled current source, an output of the controlled current source is connected to the current amplifier for impressing an output current of the controlled current source in the current amplifier, an input of the controlled current source to form a regulation element of a control loop is connected by a first switching device of the adjusting circuit to an output of the current amplifier and to form a holding element is disconnected from the output of the current amplifier by the first switching device. The controlled current source, acting as a regulation element in the control loop, is set up to regulate the offset to a minimum by setting of a current value of the output current, and the controlled current source, acting as a holding element, is set up to hold the current value, associated with the minimum, of the output current.

32 Claims, 3 Drawing Sheets

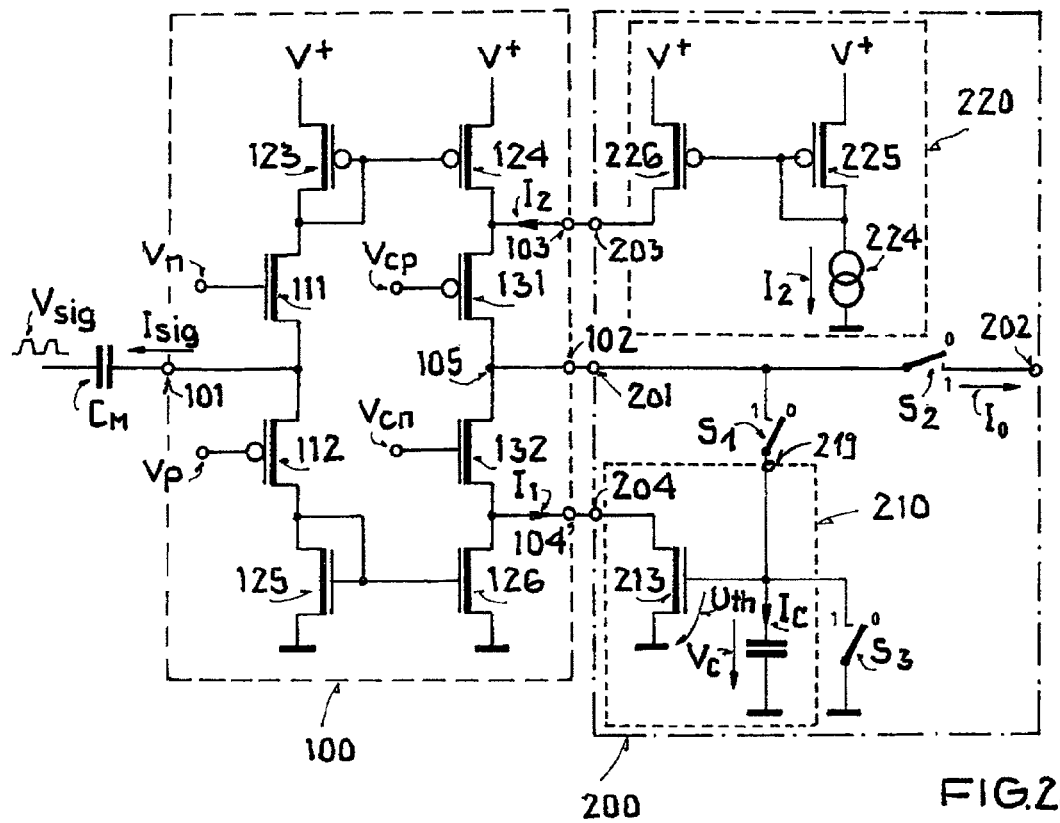
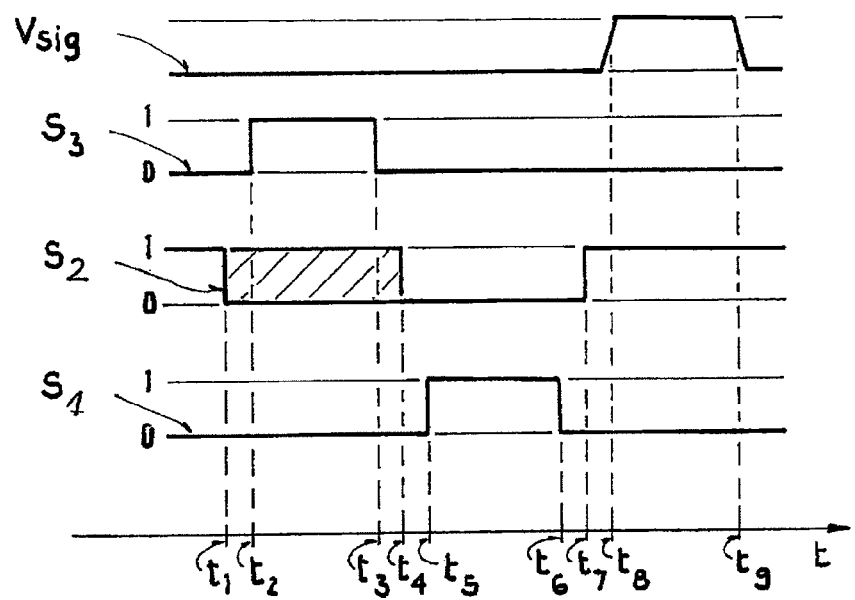
FIG.2a
FIG.2b

US 8,289,082 B2

CIRCUIT AND METHOD FOR ADJUSTING AN OFFSET OUTPUT CURRENT FOR AN INPUT CURRENT AMPLIFIER

This nonprovisional application claims priority to German Patent Application No. DE 10 2009 060 504.4, which was filed in Germany on Dec. 23, 2009, and to U.S. Provisional Application No. 61/289,846, which was filed on Dec. 23, 2009, and which are both herein incorporated by reference.

BACKGROUND OF THE INVENTION

1. Field of the Invention

The present invention relates to a circuit and method for setting an offset output current for an input current amplifier.

2. Description of the Background Art

A current amplifier (CC-OPV) is known, for example, from "Halbleiterschaltungstechnik" (Semiconductor Technology), Tietze, Schenk, $12^{th}$ edition, 2002, pages 563-565.

SUMMARY OF THE INVENTION

It is an object of the present invention to improve a circuit with a current amplifier as much as possible. Accordingly, a circuit is provided which can be monolithically integrated on a semiconductor chip.

The circuit can have a current amplifier and an adjusting circuit. The current amplifier has a current input and at a current output outputs the amplified input current as an output current at a current output of the current amplifier. A current amplifier for amplifying small input currents can also be called an input current amplifier. The adjusting circuit is set up to correct an offset of the output current of the current amplifier.

The adjusting circuit can have a controlled current source. The controlled current source provides an output current, which depends on a control variable, particularly a control voltage. The output current of the controlled current source is also constant with a constant control variable.

The output of the controlled current source can be connected to the current amplifier for impressing the output current of the controlled current source in the current amplifier. Preferably, the controlled current source is connected to an output of the current amplifier. Alternatively, the controlled current source can also be connected to an input of the current amplifier.

An input of the controlled current source, to form a regulation element of a control loop, can be connected by a first switching device of the adjusting circuit to the output of the current amplifier. The first switching device is, for example, a semiconductor switch, particularly a transmission gate or a field-effect transistor.

The input of the controlled current source, to form a holding element, moreover, is disconnected from the output of the current amplifier by the first switching device. The controlled current source in the closed switch position of the first switching device as a first function therefore has a regulation function as a regulation element of the control loop and in synergy in the open switch position of the first switching device as a second function has a holding function as a holding element. The control loop in this regard can be closed by the first switching device. The control loop is disconnected by opening of the first switching device. In the disconnected state, the output current of the controlled current source acting as a holding element for the amplification of a temporally succeeding input signal is substantially constant.

The controlled current source, acting as a regulation element in the control loop, is set up to regulate the offset to a minimum by setting a current value of the output current. The minimum offset is achieved when the output current from a current amplifier has reached a steady state; therefore it is substantially constant, ideally zero.

The regulation function is ended when the steady state is attained. The controlled current source, now acting as a holding element, is set up to hold the output current value associated with the offset minimum. The controlled current source acting as a holding element holds the output current substantially constant in this regard at least for the duration of an amplification of input signals of the current amplifier.

The object of the invention further is to provide a method for correcting an offset of a current amplifier. Accordingly, a method is provided for correcting an offset of an output current of a current amplifier of a circuit. In this regard, the method can be carried out by a control device.

In the method, a controlled current source, to form a regulation element of a control loop, is connected by a first switching device to an output of the current amplifier. The control loop in this case is formed to regulate to a steady state.

The offset is regulated to a minimum by setting a current value of the output current of the controlled current source, acting as a regulation element. The current value in a regulated state belongs to the minimum offset. The regulation occurs when an input signal of the current amplifier has a constant value. Therefore, only a direct current value but not an alternating current is present at the input of the current amplifier during the regulation. Ideally, the direct current value, present at the input of the current amplifier, of the input signal is zero.

The controlled current source, to form a holding element for holding the output current value, associated with the minimum, of the controlled current source, is disconnected by the first switching device from the output of the current amplifier. In this regard, the current value is held by the controlled current source until amplification, following the regulation, of a time-variant input signal has occurred at the input of the current amplifier.

The embodiments described hereinafter relate to the circuit and to the adjusting method. The functional features of the circuit in this regard emerge from the method features. Method features can be derived from the functions of the circuit.

In an embodiment, the controlled current source of the circuit has a capacitor. The capacitor in this case can be formed by an integrated capacitor, for example, a MIM capacitor, or by a capacitor of an active component, such as the gate-source capacitor of a field-effect transistor. Preferably, the first switching device is connected to the capacitor. Preferably, a current can be connected for charging the capacitor by the first switching device.

An embodiment provides that it is possible to control the controlled current source by a control voltage. In this regard, the control voltage can be generated by an element of the controlled current source itself.

According to an refinement, the controlled current source has a transistor. The transistor is preferably a field-effect transistor. The transistor controls the output current of the controlled current source by a control voltage at the control input of the transistor.

In another embodiment, it is provided that the controlled current source has a storage device, such as a capacitor, for storing the control voltage. The output current of the controlled current source can be kept constant in its function as a holding element by means of the stored control voltage. Alternatively, in a more elaborate embodiment, a digital value as well for controlling the controlled current source could be stored.

According to an embodiment, the capacitor of the controlled current source, acting as a regulation element, can be connected to the output of the input current amplifier. The connection can occur by means of the first switching device for charging the capacitor until a steady state is attained for the minimum offset. In the steady state, the charging current is reduced to a minimum by the capacitor.

According to another embodiment, the adjusting circuit can have a constant current source, which is connected to the current amplifier for impressing a constant current. The constant current source can be connected to an output of the current amplifier. Alternatively, the constant current source can also be connected to an input of the current amplifier. In this case, the constant current of the constant current source is also amplified by the current amplifier. Preferably, the current flow, produced by the constant current at the output of the current amplifier, is greater than the maximum offset of the current amplifier. The maximum offset can be determined, for example, by means of a simulation.

It is provided in an embodiment that an output current of the controlled current source, said current which is impressed in the current amplifier, at the output of the current amplifier causes a current flow that is directed opposite to a current flow of the constant current. In this case, the constant current together with the offset can be compensated predominantly by the current flow caused by the controlled current source. The output current of the controlled current source is impressed in the output of the current amplifier. Both the constant current of the constant current source and the output current of the controlled current source are impressed in the output of the current amplifier and have an opposite current direction. Alternatively, one of the two or both currents of the constant current source and the controlled current source can be impressed in an input in the amplification path of the current amplifier and act according to the amplification in an opposite current direction at the output of the current amplifier.

In an embodiment, it is provided that the current amplifier has a first current mirror and a second current mirror for current amplification. The outputs of the current mirrors are connected to the current output of the current amplifier and therefore to the output of the circuit. The first current mirror of an amplification can be assigned a positive signal current at the current input of the current amplifier and the second current mirror of an amplification a negative signal current at the current input of the current amplifier. Preferably, the constant current source and/or the controlled current source are connected to the first and/or second current mirror.

The current amplifier can have a current summing node connected to the output of the current amplifier. Preferably, a first current and a second current are summed in the current summing node. The second current is the constant current of the constant current source or is based on the constant current of the constant current source. The second current is the output current of the controlled current source or is based on the output current of the controlled current source.

The constant current source can be connected to the output of the current amplifier directly or via a component, such as a field-effect transistor. Preferably, the controlled current source is connected to the output of the current amplifier directly or via a component, such as a field-effect transistor. The first current or the second current enters the summation with a negative sign. If the constant current source and the controlled current source are connected to the output of the current amplifier, the constant current of the constant current source or the output current of the controlled current source enters the summation with a negative sign.

In an embodiment, the adjusting circuit has a second switching device. The second switching device is connected via an input of the adjusting circuit to the output of the current amplifier and to the circuit output. The output of the circuit can be disconnected from the output of the current amplifier and can be connected to the output of the current amplifier by means of the second switching device. The second switching device is, for example, a semiconductor switch, particularly a transmission gate or a field-effect transistor.

According to an embodiment, it is provided that the adjusting circuit has a third switching device. The third switching device is connected to the capacitor of the controlled current source and is formed to discharge the capacitor in the closed state.

In an embodiment, the circuit has a control circuit which is connected to the adjusting circuit.

The control circuit, to control the first switching device, can be connected to a first control terminal of the first switching device. The control circuit, to control the second switching device, is preferably connected to a second control terminal of the second switching device. The control circuit, to control the third switching device, is preferably connected to a third control terminal of the third switching device. The control circuit preferably has a number of delay elements for a time-dependent control.

The control circuit can be set up in a first step to disconnect the output of the current amplifier from the circuit output by opening the second switching device. Preferably, the control circuit is set up in a second step to connect the capacitor of the controlled current source to the output of the current amplifier by closing the first switching device, whereby after the second step the capacitor is charged by a charging current and by the charging of the capacitor an output current of the controlled current source is increased until a minimum is attained at a current value of the steady state of the charging current. Preferably, the control circuit is set up in a third step to disconnect the charged capacitor of the controlled current source from the output of the current amplifier by opening the first switching device.

The control circuit can be set up in a fourth step to connect the output of the current amplifier to the circuit output by closing the second switching device.

According to an embodiment, the method has several process steps, which are carried out, for example, by a state machine or a program sequence in an arithmetic unit. First, the third switching device can be temporarily closed, so that the capacitor is discharged via the third switching device. Then, the third switching device is opened again.

Next, in a process step the capacitor of the controlled current source is connected to the output of the current amplifier by closing the first switching device. Moreover, an output of the current amplifier is disconnected from a circuit output by opening of the second switching device, so that the regulation process produces no desirable output signal. After this process step, the capacitor is charged by the charging current. An output current of the controlled current source is increased by the charging of the capacitor until the charging current attains a minimum.

In a subsequent process step, the charged capacitor of the controlled current source is disconnected from the output of the current amplifier by opening of the first switching device. In a subsequent process step, the output of the current amplifier is connected to the circuit output by closing of the second switching device in order to output a signal, amplified by the current amplifier, as an output signal.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein:

FIG. 2a shows a circuit diagram of a first exemplary embodiment;

FIG. 2b shows a schematic diagram; and

DETAILED DESCRIPTION

Figure 1A:
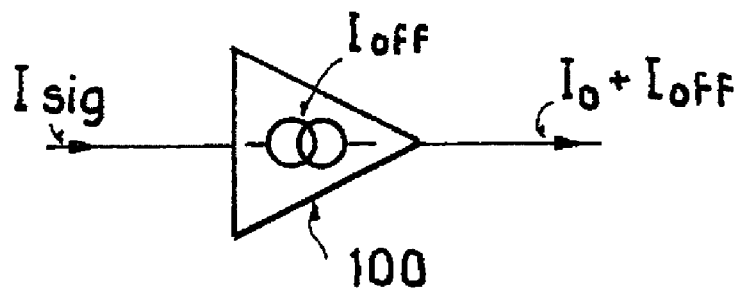
FIG. 1a shows a schematic illustration of an input current amplifier.

A current amplifier 100 with a low input impedance is shown schematically in FIG. 1, which is also called an input current amplifier below. Current amplifier 100 has a current input and a current output. The input current through the current input in this case is output at the output amplified by the current amplification of the current amplifier. In this case, a signal output current Io at the circuit output is superposed by an undesirable offset Ioff at the output. The offset Ioff is caused by process variations during the production of amplifier transistors of input current amplifier 100 and is shown schematically in FIG. 1a as current source Ioff. The amplifier-inherent offset Ioff in this case can be positive or negative in regard to the current direction at the circuit output.

Figure 1B:
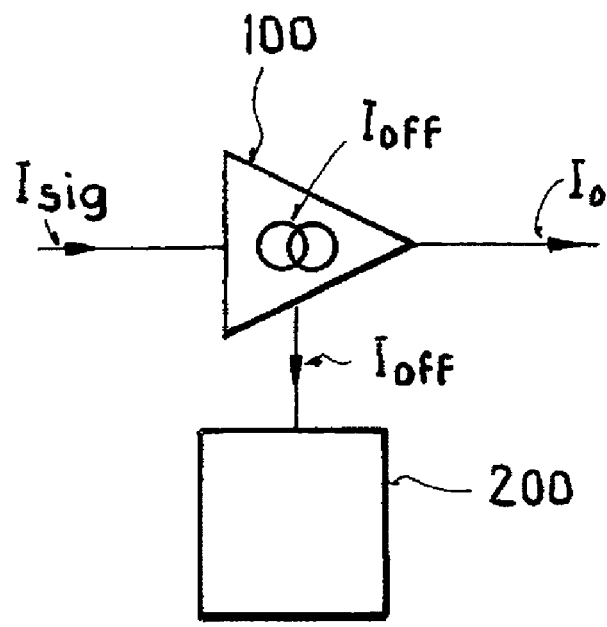
FIG. 1b shows a schematic illustration of an input current amplifier with an adjusting circuit for adjusting the offset output current.

To correct the offset Ioff at the circuit output, an adjusting circuit 200, which compensates at least predominantly the Offset Ioff at the output of the circuit and in the ideal case subtracts completely the amplifier-intrinsic offset Ioff, is provided in FIG. 1b.

An example for an input current amplifier 100 with a low-ohmic input impedance at the current input of current amplifier 100 is shown in FIG. 2a as a circuit diagram. Further, an exemplary embodiment of an adjusting circuit 200 for adjusting the offset Ioff of input current amplifier 100 is shown in FIG. 2a. PMOS transistors 123 and 124 form a first current mirror of input current amplifier 100 with a first transformation ratio. The first current mirror 123, 124 is connected to the supply voltage V+. NMOS transistors 125 and 126 form a second current mirror of input current amplifier 100 with a second transformation ratio. The second current mirror 125, 126 is connected to ground. In the ideal case, the first transformation ratio and the second transformation ratio would be precisely the same. Because of process deviations during production, the first transformation ratio and the second transformation ratio, however, do not turn out precisely the same and therefore cause the offset Ioff at the current output of current amplifier 100. PMOS transistor 112 and NMOS transistor 111, connected to input 101 of input current amplifier 100, are used to adjust the voltage at input 101 by means of the gate voltages Vn and Vp. For example, the voltage at input 101 is adjusted to half the operating voltage V+/2 by means of gate voltages Vn and Vp.

Output transistor 124 of the first current mirror is connected via PMOS transistor 131 to a current summing node 105 and an output 102 of input current amplifier 100. Output transistor 126 of the second current mirror is connected via NMOS transistor 132 to current summing node 105 and output 102 of input current amplifier 100. Transistors 131 and 132 are controlled by the gate voltages Vcp and Vcn and cause an increase in the output resistance of input current amplifier 100 (cascode current mirror).

Further, adjusting circuit 200, which is connected to input current amplifier 100 for adjusting and therefore for correcting the offset Ioff, is shown in FIG. 2a. Preferably, adjusting circuit 200 is formed to adjust the offset Ioff to a minimum, preferably to the value of zero. Adjusting circuit 200 has two current sources, a controlled current source 210 and a constant current source 220, which in the exemplary embodiment of FIG. 2a are connected to output 102 of input current amplifier 100.

Constant current source 220 generates a constant current I2. Constant current I2 is greater in terms of value than the maximum expected offset Ioff. The maximum expected offset Ioff can be determined, for example, by simulating process deviations. Constant current source 220 in the exemplary embodiment of FIG. 2a is connected to PMOS output transistor 124 of the first current mirror via terminal 203 of adjusting circuit 200 and terminal 103 of input current amplifier 100. The output current of output transistor 124 of the first current mirror and the constant current I2 are summed in the terminal node. Constant current source 220 is therefore connected via PMOS transistor 131 to output 102 of input current amplifier 100. It would also be possible to connect constant current source 220 directly to output 102 of input amplifier 100. In the exemplary embodiment of FIG. 2a, constant current source 220 has a current source 224 and a current mirror comprising PMOS transistors 225, 226 to generate constant current I2.

Controlled current source 210 generates a controlled current I1 as the output current. The controlled current source 210 in the exemplary embodiment of FIG. 2a is connected to NMOS output transistor 126 of the second current mirror via terminal 204 of adjusting circuit 200 and via terminal 104 of input current amplifier 100. The output current of NMOS output transistor 126 of the second current mirror and output current I1 of controlled current source 210 are summed in the terminal node. Controlled current source 210 is therefore connected via NMOS transistor 132 to output 102 of input current amplifier 100. It would also be possible to connect controlled current source 210 directly to output 102 of input amplifier 100.

Controlled current source 210 has a capacitor 212. A voltage Uc dropping across capacitor 212 controls output current I1 of controlled current source 210. In the exemplary embodiment of FIG. 2a, an NMOS transistor 213 is provided as an element for voltage-current conversion. The voltage Uc dropping across capacitor 212 in this case is present as gate-source voltage at NMOS transistor 213. If the voltage Uc dropping across capacitor 212 is zero, NMOS transistor 213 blocks. With an increasing voltage Uc, the gate-source voltage increases and turns on NMOS transistor 213, so that output current I1 also increases. Output current I1 increases until the sum of the amplifier-intrinsic offset Ioff, constant current I2, and output current I1 of controlled current source 210 reaches a minimum. Capacitor 212 is no longer charged and the voltage Uc is constant. An especially rapid adjustment of the steady state is achieved in this way, so that the time during which the input current amplifier is not available for current amplification of the input signal Isig is minimized.

Constant current source 220 and controlled current source 210 in this regard are connected to output 102 of the input current amplifier 100 in such a way that the constant current I2 and output current I1 of controlled current source 210 are summed, whereby one of the two currents enters the summation with a negative sign. The current direction, acting in node 105 and therefore at output 102, of the constant current I2 and the current direction, acting in node 105 and therefore at output 102, of the output current I1 of the controlled current source 210 are therefore opposite. If the technical current direction in FIG. 2a is considered, constant current I2 flows into summing node 105. In contrast, output current I1 of controlled current source 210 flows out of summing node 105, therefore enters the summation as negative.

As an alternative to the exemplary embodiment of FIG. 2a, constant current source 220 and/or controlled current source 210 can be connected to current input 101 of current amplifier 100. If constant current source 220 is connected to input 101, constant current I2 is amplified by current amplifier 100. If controlled current source 210 is connected to input 101, the output current I1 thereof is amplified by current amplifier 100. If both constant current source 220 and controlled current source 210 are connected to current input 101, a difference current (I1-I2) between constant current I2 and output current I1 of controlled current source 210 is amplified accordingly by current amplifier 100. In these three embodiment variants as well, a regulation of the offset Ioff to a minimum is possible, so that in the case of amplification of an input current signal Isig no or only a negligible offset Ioff interferes with the output signal Io of the circuit.

Constant current I2, which is greater than the offset Ioff in value, is impressed on output 102 of input current amplifier 100 by adjusting circuit 200, shown in FIG. 2a, for adjusting the offset (Ioff. Likewise at output 102 of current amplifier 100, output current I1 of controlled current source 210 is impressed with the current direction opposite to I2. Adjusting circuit 200, moreover, has a first switching device S1 and a second switching device S2. First switching device S1 in this regard is connected to output 102 of adjusting circuit 200 and to an input 219 of controlled current source 210. In the closed state, first switching device S1 connects output 102 of adjusting circuit 200 to input 219 of controlled current source 210 and forms a control loop, whereby controlled current source 210 acts as a regulation element of this control loop. In said control loop, the actual value is the current Ic through terminal 102, which also charges capacitor 212. Current Ic is the same as the current through current output 102 of current amplifier 100 and therefore the same as the resulting offset Ioff, which is minimized by the regulation. The actual value is compared with the target value zero, the generation of which requires no component. The control variable of the control loop is output current I1 of controlled current 210.

For regulation, second switching device S2 is open and disconnects output 202 of the circuit from output 102 of adjusting circuit 200. The input signal current Isig is zero in this case. As a result, the resulting current, which results from the summation of the output current of first current mirror 123, 124, of the output current of second current mirror 125, 126, and of constant current I2, flows out at output 102 of input current amplifier 100. Output current I1 of controlled current source 210 is equal to zero because of the initially still discharged capacitor 212.

By charging capacitor 212 by charging current Ic, the gate of NMOS transistor 213 is controlled so that the controlled current source 210 as a regulation element sets a current value of output current I1 of controlled current source 210, so that the current through output 102 is regulated to a steady state, whereby output current I1 of controlled current source 210 again draws off specifically the sum of constant current I2 and the amplifier-intrinsic offset Ioff. In this case, the offset Ioff active at output 102 is regulated to a minimum and thereby to a constant value, ideally zero. In the steady state, the current value of output current I1 of controlled current source 210 is constant.

The amplifier-intrinsic offset Ioff can be positive or negative. Capacitor 212 and NMOS transistor 213 form the regulation element of the control loop. In the steady state, output current I1 is equal to the (signed) sum of the constant current I2 and amplifier-intrinsic offset Ioff. In the steady state case, therefore, a constant current no longer flows out of output 102 of input current amplifier 100, so that charging current Ic as well is zero.

A diagram for the control signals of switching devices S1, S2, and S3 of adjusting circuit 200 is shown schematically in FIG. 2b. Between time points t1 and t4, second switching device S2 is opened and disconnects circuit output 202 from output 102 of input current amplifier 100. Before, during, or after the opening of second switching device S2, a third switching device S3 is closed, which in the closed state short-circuits capacitor 212, so that capacitor 212 discharges via third switching device S3 between time points t2 and t3.

At time point t5, both second switching device S2 and third switching device S3 are in the switch position open "0." In contrast, first switching device S1 between time points t5 and t6 is controlled into the switch position closed "1." Between time points t5 and t6, capacitor 212 is connected via first switching device S1 to output 102 of input current amplifier 100. Between the time points t5 and t6, therefore, as previously described, capacitor 212 is charged until the steady state is attained.

At time t6, first switching device S1 is opened and again disconnects capacitor 212 from output 102 of input current amplifier 100. Only a very low leakage current thereby flows through capacitor 212, the gate of transistor 213 and first and third switching device S1, S3, so that the charging of capacitor 212 is substantially retained for a longer time. The charge is stored in capacitor 212 as storage device, so that the current value of output current I1 of controlled current source 210 remains substantially constant. Timewise after time point t6, at time point t7, second switching device S2 is closed and the output of input current amplifier 100 is connected to circuit output 202. A time difference is therefore provided between time points t6 and t7. Switching devices S1 and S2 are preferably not closed simultaneously. Switching devices S1, S2, S3 are preferably semiconductor switches, for example, in the form of field-effect transistors or transmission gates.

Between time points t8 and t9, a voltage signal Vsig is sent to a capacitor Cm of a touch screen. If the screen is touched, the capacitor Cm is changed and moreover a signal current Isig is produced, which flows as an input current via input 101 into/out of input current amplifier 100 and is amplified by input current amplifier 100. A readjustment of output current I1 of controlled current source 210 can occur, for example, before each signal or before a group of signals with the signal voltage Vsig. Preferably, the adjustment of output current I1 of controlled current source 210 occurs within a time interval of, for example, 500 us. For example, the adjustment of output current I1 of controlled current source 210 occurs periodically. Advantageously, the time interval or the periods can be adjusted.

Figure 3:
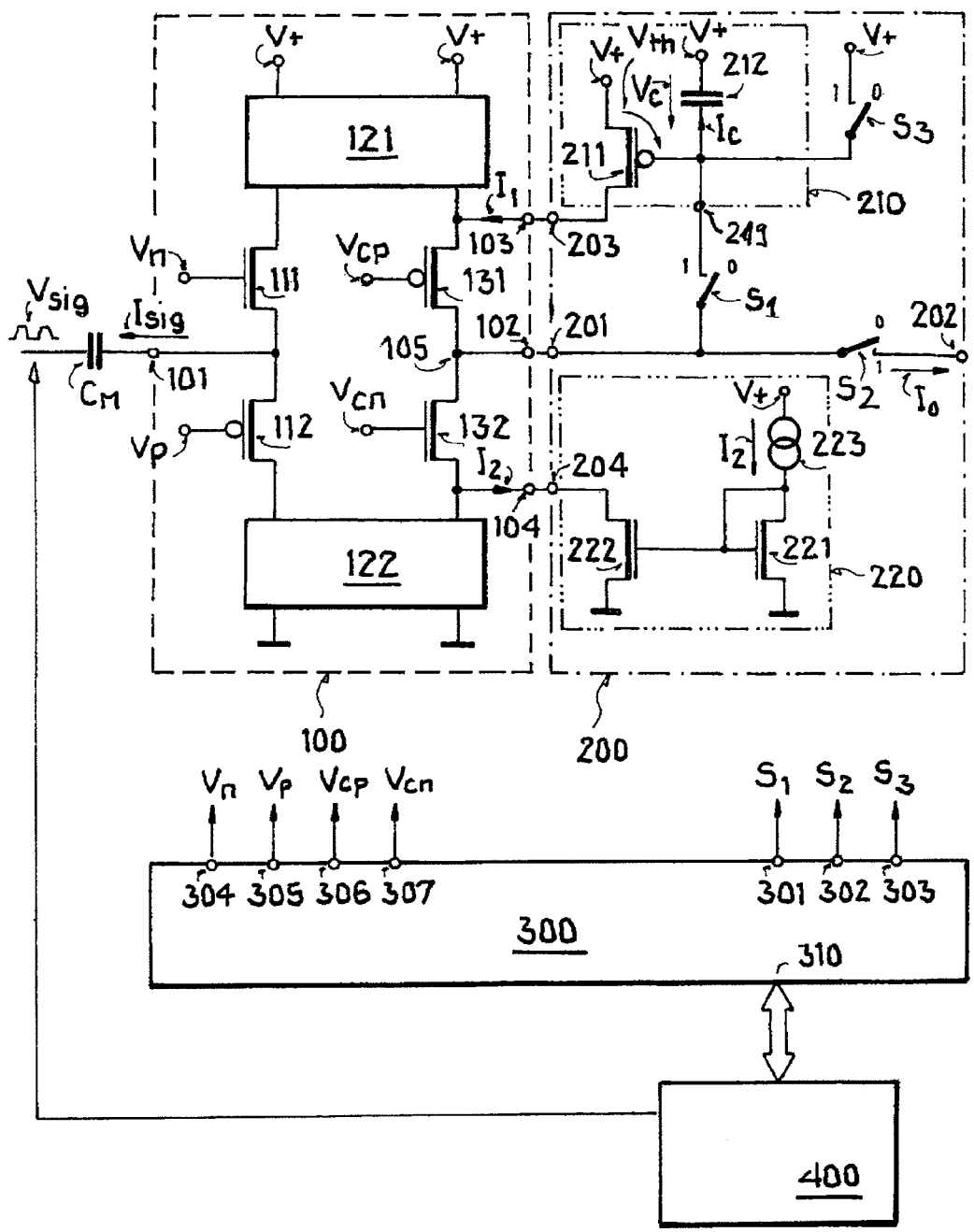
FIG. 3 shows a circuit diagram of another exemplary embodiment.

Another exemplary embodiment for the use of a touch screen is shown schematically in FIG. 3 as circuit diagram. The exemplary embodiment of FIG. 3 also has an input current amplifier 100 with a low-ohmic input impedance. Input current amplifier 100 has two current mirrors 121 and 122 and four transistors 111, 112, 131, 132 analogous to FIG. 2a. Constant current source 220, with current source 223 and NMOS transistors 221 and 222, to output constant current I2 is formed accordingly complementary to constant current source 220 of FIG. 2a. Therefore, constant current I2 in keeping with the technical current direction flows into constant current source 220. A controlled current source 210 with a capacitor 212 and a PMOS transistor 211 is also formed complementary to controlled current source 210 of FIG. 2a. Switching devices S1 and S3 are accordingly closed. The operation of adjusting circuit 200 corresponds here substantially to the operation of the adjusting circuit of FIG. 2a. If the control loop with the regulation element of controlled current source 210 with PMOS transistor 211 and capacitor 212 is activated by the closing of first switching device S1, current Ic flows to charge capacitor 212 into output 102 of input current amplifier 100 until in the steady state output current I1 of controlled current source 210 is the same as the (signed) sum of constant current I2 and offset Ioff.

Furthermore, a control circuit 300, which has an interface 310 to an arithmetic unit 400, such as, for example, a microprocessor, is shown in FIG. 3. Control circuit 300 is formed to control the described time course. Control circuit 300 is set up in a first step to disconnect output 102 of input current amplifier 100 from circuit output 202 by opening the second switching device S2. To this end, control circuit 300 via output 301 sends a control signal, for example, according to FIG. 2b, to second switching device S2.

Control circuit 300 is set up in the first step to close a third switching device S3, so that capacitor 212 is discharged via third switching device S3. To this end, control circuit 300 via output 303 sends a control signal, for example, according to FIG. 2b, to third switching device S3. This step is optional, and thus the regulation can be started also with a partially charged capacitor 212.

Control circuit 300 is set up in a second step to connect capacitor 212 of controlled current source 210 to output 102 of input current amplifier 100 by closing first switching device S1. To this end, control circuit 300 via output 302 sends a control signal, for example, according to FIG. 2b, to first switching device S1. After the second step, capacitor 212 is charged by a charging current Ic. An output current I1 of controlled current source 210 is increased by the charging of capacitor 212 until the charging current Ic attains a minimum.

Control circuit 300 is set up in a third step to disconnect charged capacitor 212 of controlled current source 210 from output 102 of input current amplifier 100 by opening first switching device S1. Furthermore, control circuit 300 is set up in a fourth step to connect output 102 of input current amplifier 100 to circuit output 202 by closing second switching device S2.

Control circuit 300 for generating the signals and their time sequence has a logic and a number of delay elements, for example, at least two delay elements (not shown in FIG. 3). The delay elements are triggered by arithmetic unit 400 via interface 310 to generate the signals Vsig.

The invention is not limited to the shown embodiment variants in FIGS. 1 through 3. For example, it is possible to provide a different input current amplifier. It is also possible to provide a different voltage-current conversion of the controlled current source instead of transistors 213, 211. The functionality of the circuit according to FIG. 2a can be used especially advantageously for a touch screen.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A circuit comprising:
a current amplifier; and
an adjusting circuit configured to correct an offset of an output current of the current amplifier, the adjusting circuit having a controlled current source and a first switching device,
wherein an output of the controlled current source is connectable to the current amplifier for producing an output current of the controlled current source in the current amplifier,
wherein an input of the controlled current source is connectable by the first switching device of the adjusting circuit to an output of the current amplifier to form a regulation element of a control loop,
wherein the input of the controlled current source is disconnected from the output of the current amplifier by the first switching device to form a holding element,
wherein the controlled current source, acting as a regulation element in the control loop, is configured to regulate the offset to a minimum by setting a current value of the output current, and
wherein the controlled current source, acting as a holding element, is configured to hold the current value, associated with the minimum, of the output current.

2. The circuit according to claim 1, wherein the controlled current source has a capacitor.

3. The circuit according to claim 1, wherein the controlled current source is controllable by a control voltage.

4. The circuit according to claim 1, wherein the controlled current source has a transistor, which by means of a control voltage at a control input of the transistor controls the output current of the controlled current source.

5. The circuit according to claim 1, wherein the controlled current source has a storage device or a capacitor for storing a control voltage.

6. The circuit according to claim 5, wherein the controlled current source has the capacitor and the capacitor of the controlled current source, which acts as a regulation element, is connectable to the output of the current amplifier by the first switching device for charging the capacitor until a steady state is attained for a minimum offset.

7. The circuit according to claim 1, wherein the current amplifier has a first current mirror and a second current mirror for current amplification, whose outputs are connected to the output of the current amplifier.

8. The circuit according to claim 1, wherein the adjusting circuit has a constant current source, which is connected to the current amplifier for producing a constant current.

9. The circuit according to claim 8, wherein the current amplifier has a current summing node that is connectable to the output of the current amplifier, wherein at least one first current and one second current are summed in the current summing node, wherein the first current is the output current of the controlled current source or is based on the output current of the controlled current source, and wherein the second current is the constant current of the constant current source or is based on the constant current of the constant current source.

10. The circuit according to claim 9, wherein the first current or the second current enters the summation with a negative sign.

11. The circuit according to claim 1, wherein the adjusting circuit has a second switching device that is connectable via an input of the adjusting circuit to the output of the current amplifier and to the circuit output.

12. The circuit according to claim 1, wherein the adjusting circuit has a second switching device, which is connectable to a capacitor and is configured to discharge the capacitor in a closed state.

13. The circuit according to claim 1, further comprising a control circuit that is configured to control the first switching device and is connectable to a control terminal of the first switching device.

14. The circuit according to claim 11, further comprising a control circuit that is connectable to a control terminal of the second switching device to control the second switching device.

15. The circuit according to claim 12, further comprising a control circuit that is connectable to a control terminal of the second switching device to control the second switching device.

16. The circuit according to claim 1, further comprising a control circuit that is configured:
in a first step, to disconnect the output of the current amplifier from the circuit output by opening of a second switching device,
in a second step, to connect a capacitor of the controlled current source to the output of the current amplifier by closing the first switching device, after the second step a capacitor is charged by a charging current and by the charging of the capacitor an output current of the controlled current source is increased until the charging current attains a minimum,
in a third step, to disconnect the charged capacitor of the controlled current source from the output of the current amplifier by opening the first switching device, and
in a fourth step, to connect the output of the current amplifier to the circuit output by closing the second switching device.

17. A method for correcting an offset of an output current of a current amplifier of a circuit, the method comprising:
connecting a controlled current source to an output of the current amplifier via a first switching device, to form a regulation element of a control loop;
regulating an offset to a minimum by setting a current value of the output current of the controlled current source when an input signal of the current amplifier has a constant value, the controlled current source acting as the regulation element; and
disconnecting the controlled current source from the output of the current amplifier by the first switching device to form a holding element for holding the current value associated with the minimum of the output current.

18. The method according to claim 17, wherein the controlled current source has a capacitor.

19. The method according to claim 17, wherein the controlled current source is controllable by a control voltage.

20. The method according to claim 17, wherein the controlled current source has a transistor, which by means of a control voltage at a control input of the transistor controls the output current of the controlled current source.

21. The method according to claim 17, wherein the controlled current source has a storage device or a capacitor for storing a control voltage.

22. The method according to claim 21, wherein the controlled current source has the capacitor and the capacitor of the controlled current source, which acts as a regulation element, is connectable to the output of the current amplifier by the first switching device for charging the capacitor until a steady state is attained for a minimum offset.

23. The method according to claim 17, wherein the current amplifier has a first current mirror and a second current mirror for current amplification, whose outputs are connected to the output of the current amplifier.

24. The method according to claim 17, wherein an adjusting circuit has a constant current source, which is connected to the current amplifier for producing a constant current.

25. The method according to claim 24, wherein the current amplifier has a current summing node that is connectable to the output of the current amplifier, wherein at least one first current and one second current are summed in the current summing node, wherein the first current is the output current of the controlled current source or is based on the output current of the controlled current source, and wherein the second current is the constant current of the constant current source or is based on the constant current of the constant current source.

26. The method according to claim 25, wherein the first current or the second current enters the summation with a negative sign.

27. The method according to claim 17, wherein an adjusting circuit has a second switching device that is connectable via an input of the adjusting circuit to the output of the current amplifier and to the circuit output.

28. The method according to claim 17, wherein an adjusting circuit has a second switching device, which is connectable to a capacitor and is configured to discharge the capacitor in a closed state.

29. The method according to claim 17, further comprising a control circuit that is configured to control the first switching device and is connectable to a control terminal of the first switching device.

30. The method according to claim 27, further comprising a control circuit that is connectable to a control terminal of the second switching device to control the second switching device.

31. The method according to claim 28, further comprising a control circuit that is connectable to a control terminal of the second switching device to control the second switching device.

32. The method according to claim 17, further comprising:
disconnecting, by a control circuit in a first step, the output of the current amplifier from the circuit output by opening of a second switching device,
connecting, by the control circuit and in a second step, a capacitor of the controlled current source to the output of the current amplifier by closing the first switching device, after the second step a capacitor is charged by a charging current and by the charging of the capacitor an output current of the controlled current source is increased until the charging current attains a minimum,
disconnecting, by the control circuit and in a third step, the charged capacitor of the controlled current source from the output of the current amplifier by opening the first switching device, and
connecting, by the control circuit and in a fourth step, the output of the current amplifier to the circuit output by closing the second switching device.

* * * * *